United States Patent
Hayes et al.

(10) Patent No.: US 7,376,408 B2
(45) Date of Patent: May 20, 2008

(54) REDUCTION OF NEAR FIELD ELECTRO-MAGNETIC SCATTERING USING HIGH IMPEDANCE METALLIZATION TERMINATIONS

(75) Inventors: Gerard James Hayes, Wake Forest, NC (US); Scott Ladell Vance, Cary, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 599 days.

(21) Appl. No.: 10/710,876

(22) Filed: Aug. 10, 2004

(65) Prior Publication Data

US 2006/0035607 A1    Feb. 16, 2006

(51) Int. Cl.
*H04B 1/10* (2006.01)
*H01P 1/00* (2006.01)

(52) U.S. Cl. .................. 455/300; 455/301; 333/12; 361/818

(58) Field of Classification Search ............ 455/300, 455/301; 361/760, 761, 763, 777, 816, 818; 333/167, 12, 202
See application file for complete search history.

(56) References Cited

U.S. PATENT DOCUMENTS

| | | | | |
|---|---|---|---|---|
| 5,926,377 A | * | 7/1999 | Nakao et al. ............... | 361/763 |
| 5,966,294 A | * | 10/1999 | Harada et al. ............. | 361/794 |
| 6,150,895 A | * | 11/2000 | Steigerwald et al. ....... | 333/12 |
| 6,215,373 B1 | * | 4/2001 | Novak et al. .............. | 333/22 R |
| 6,557,154 B1 | * | 4/2003 | Harada et al. ............. | 716/11 |
| 6,668,025 B1 | * | 12/2003 | Sumi et al. ................ | 375/326 |
| 6,775,122 B1 | * | 8/2004 | Dishongh et al. .......... | 361/301.5 |
| 6,791,434 B2 | * | 9/2004 | Tsujiguchi ................. | 333/172 |
| 6,870,436 B2 | * | 3/2005 | Grebenkemper ........... | 333/12 |
| 7,180,718 B2 | * | 2/2007 | Anthony et al. ........... | 361/118 |

OTHER PUBLICATIONS

Sony Ericsson Mobile Communications AB, et al., International Application No. PCT/US2005/006509, "International Report on Patentability" Nov. 9, 2006.
Sony Ericsson Mobile Communications AB, *International Application Ser. No. PCT/US2005/006509*, "International Search Report", Aug. 19, 2005.
Sony Ericsson Mobile Communications AB, *International Application Ser. No. PCT/US2005/006509*, "Written Opinion", Aug. 19, 2005.

* cited by examiner

*Primary Examiner*—Blane J Jackson
(74) *Attorney, Agent, or Firm*—Frederick D. Bailey; Moore & Van Allen, PLLC

(57) ABSTRACT

The present invention uses metallization termination techniques to reduce the electro-magnetic field scattering at the edges of metallized areas. The metallization termination techniques provide a gradual transition from high conductivity areas to high impedance areas. The mobile phone antenna illuminates the PCB allowing currents to flow on the PCB. When the currents reach edges of the PCB they flow through a region of increasingly high impedance without reflecting back or scattering.

10 Claims, 3 Drawing Sheets

REDUCTION OF NEAR FIELD ELECTRO-MAGNETIC SCATTERING USING HIGH IMPEDANCE METALLIZATION TERMINATIONS

BACKGROUND OF INVENTION

The United States Federal Communications Commission (FCC) is set to enact new regulations in 2005 to improve hearing aid compatibility (HAC) for hearing impaired users of mobile phones. As part of mobile phone HAC assessment, near field components of electro-magnetic fields are measured. The components are comprised of electric and magnetic fields.

FIG. 3 illustrates a typical electric field distribution for a flip-type mobile phone having a near field scan area as shown in FIG. 1 and a PCB outline as shown in FIG. 2. The dominant electric fields tend to occur at abrupt discontinuities of metallization such as at the edges of printed circuit boards (PCBs), shield cans, vibrators, and metallization patterns on the assembly. These discontinuities form concentrated electric currents on the metallic substrates that flow toward the edges of a substrate. When the current reaches an edge of a substrate, undesirable scattering of electro-magnetic fields occurs. The greater the magnitude of scattered fields, the more likely they are to interfere with hearing aid devices.

What is needed is a method, means, or apparatus for reducing the undesirable effects of electro-magnetic scattering at metallic discontinuities that exist within mobile phone designs.

SUMMARY OF INVENTION

The present invention uses metallization termination techniques to reduce the electro-magnetic field scattering at the edges of metallized areas including the PCB and metallized housing assemblies. The metallization termination techniques present a gradual transition from high conductivity areas to high impedance areas. The mobile phone antenna illuminates the PCB allowing currents to flow on the PCB. When the currents reach edges of the PCB they flow through a region of increasingly high impedance without reflecting back or scattering.

DETAILED DESCRIPTION

In a related patent application, a high impedance translucent coating was used to attenuate RF surface waves (electro-magnetic scattering) over a desired region. Such a configuration is effective for attenuating the electric field in the near field region. It also attenuates the generation of surface currents in that region. For improved antenna performance, it may be desirable to allow surface currents to flow on a region of the mobile phone such as the top portion of a flip phone. However, these currents generate scattered electro-magnetic fields at abrupt discontinuities of the PCB and other metallized areas.

As part of hearing aid compatibility (HAC) assessment, near-field components of electromagnetic fields are measured. These components comprise electric and magnetic fields.

Figure 2:
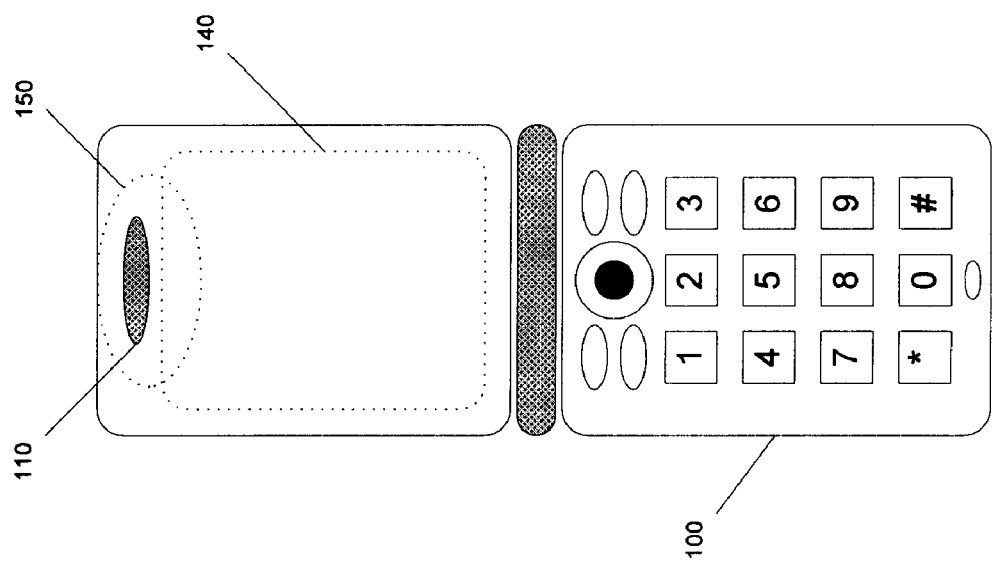
FIG. 2 is an illustration of a typical flip type mobile phone with a sample PCB outline depicted and showing an area of high field occurrence.
Figure 1:
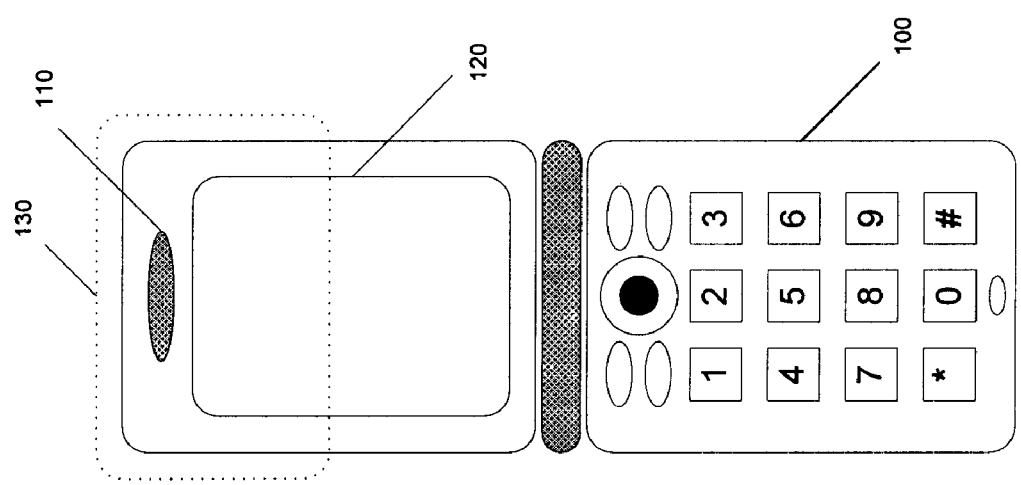
FIG. 1 is an illustration of a typical flip type mobile phone having a specified near field scan area.

FIG. 1 is an illustration of a typical flip type mobile phone 100 showing an outline of a near field scan area 130 in the top-flip around the speaker component 110 and partially encompassing the mobile phone's display 120. This is the area of greatest concern since it is the point at which a user with a hearing aid will be in closest proximity to the electro-magnetic scattering effect. FIG. 2 is an illustration of the same mobile phone 100 further showing a high field area 150 about the mobile phone's speaker 110 and an outline of an underlying printed circuit board (PCB) 140. The relatively high fields are primarily the result of metallization discontinuities present in some of the underlying mobile phone components such as the PCB 140.

Figure 3:
FIG. 3 is a graph of a measured electric field for a specified near field scan area of a flip type mobile phone.

A sample electric field distribution for the mobile phone 100 of FIGS. 1 and 2 is presented in FIG. 3. The dominant electric fields occur at abrupt discontinuities of metallization such as, but not limited to, the edge of the printed circuit board (PCB), edge of shield cans, speakers, vibrators, and the edge of metallization patterns on the assembly. These discontinuities establish concentrated points of electromagnetic scattering. The radiation from the mobile phone's antenna excites currents on the metallic substrates that flow towards the edge of the substrate. When the currents hit the edge of the substrate, scattering fields are generated.

The present invention uses metallization termination techniques to attenuate electro-magnetic field scattering at the edges of metallized areas. The metallization termination techniques provide a gradual transition from high conductivity areas to high impedance areas. The mobile phone antenna illuminates the PCB allowing currents to flow on the PCB. When the currents reach edges of the PCB they flow through a region of increasingly high impedance without reflecting back or scattering.

Figure 4:
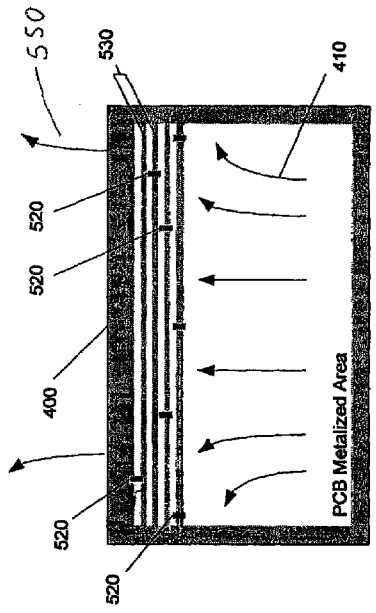
FIG. 4 illustrates one embodiment resulting in high impedance and high conductivity areas on a metallized area within a mobile phone.

FIG. 4 illustrates one embodiment of the present invention resulting in high impedance and high conductivity areas on a metallized area 400 within a mobile phone. In this embodiment electro-magnetic scattering 410 is attenuated at metallization edges by varying the metallization pattern 420. As the electro-magnetic waves scatter 410 towards the edge of the metallized area 400, they encounter progressively higher impedances 420 in the form of resistive materials. As a result, a higher impedance path is presented toward the edge of the metallized area 400, therefore resulting in attenuated electro-magnetic scattering 450 being emitted from the edge of the metallized area 400.

Figure 5:
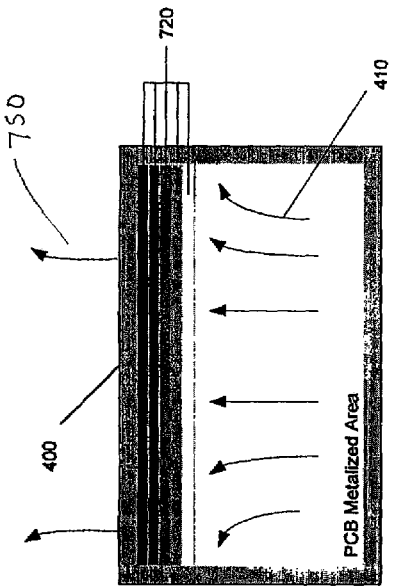
FIG. 5 illustrates another embodiment resulting in high impedance and high conductivity areas on a metallized area within a mobile phone.

FIG. 5 illustrates another embodiment resulting in high impedance and high conductivity areas on a metallized area 400 within a mobile phone. In this embodiment electromagnetic scattering 410 is attenuated at metallization edges by controlling the current path near the edge. Discrete components 520 such as resistors, inductors, or capacitors are used to control impedance. Strips of metallization 530 are used to control the current path that is followed by the scattering electro-magnetic surface waves 410. The discrete components 520 essentially obstruct the current path thereby attenuating the electro-magnetic waves by requiring them to use up much of their energy to get through the obstruction, therefore resulting in attenuated electro-magnetic scattering 550 being emitted from the edge of the metallized area 400.

Figure 6:
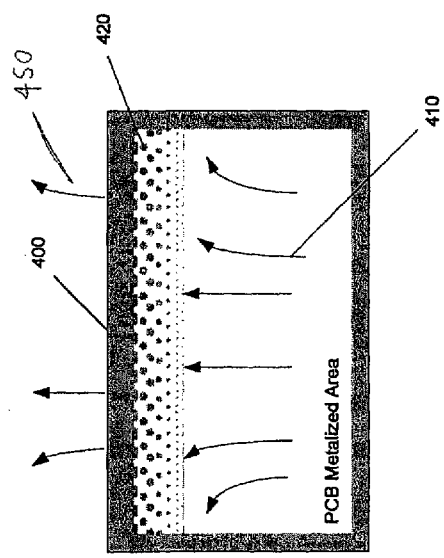
FIG. 6 illustrates yet another embodiment resulting in high impedance and high conductivity areas on a metallized area within a mobile phone.

FIG. 6 illustrates yet another embodiment resulting in high impedance and high conductivity areas on a metallized area 400 within a mobile phone. In this embodiment electro-magnetic scattering 410 is similarly attenuated at metallization edges by controlling the current path near the edge. This time, capacitive gaps 620 and inductive lines 630 are used to control the impedance near the edge. This results in the electro magnetic waves 410 having to expend significant energy to overcome the obstructions (capacitive gaps 620 and inductive lines 630) resulting in attenuated electro-magnetic scattering 650 being emitted from the edge of the metallized area 400.

Figure 7:
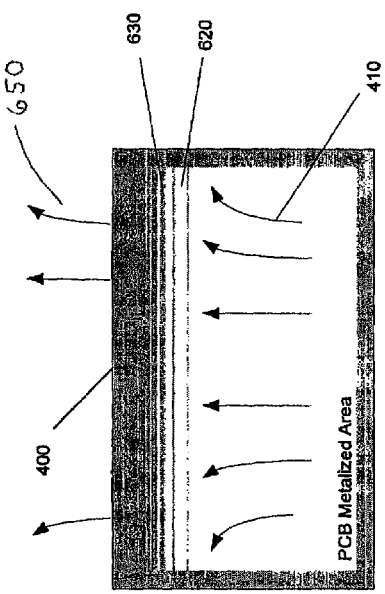
FIG. 7 illustrates still another embodiment resulting in high impedance and high conductivity areas on a metallized area within a mobile phone.

FIG. 7 illustrates still another embodiment resulting in high impedance and high conductivity areas on a metallized area 400 within a mobile phone. In this embodiment electro-magnetic scattering 410 is again attenuated at metallization edges. Various degrees of conductivity layers 720 are used to control and vary impedance near the edge. Progressively higher impedances are encountered as the current from the scattering electro-magnetic waves flows toward the edge of the metallized area 400, therefore resulting in attenuated electro-magnetic scattering 750 being emitted from the edge of the metallized area 400.

The invention claimed is:

1. A method of attenuating scattering electro-magnetic waves present on metallized areas within a mobile phone caused by components within the mobile phone, the method comprising placing discrete components near an edge of the metallized areas, the discrete components obstructing a current path of scattering electro-magnetic waves present on the metallized areas such that electric current due to the scattering electro-magnetic waves present on the metallized areas encounters higher impedances as the scattering electro-magnetic waves flow through the discrete components near the edge of the metallized areas, the higher impedances attenuating the scattering electro-magnetic waves emitted from the edge of the metallized areas.

2. The method of claim 1 wherein the discrete components include resistors.

3. The method of claim 1 wherein the discrete components include capacitors.

4. The method of claim 1 wherein the discrete components include inductors.

5. The method of claim 1 wherein the discrete components include a combination of resistors, capacitors, and inductors.

6. A mobile phone that attenuates scattering electro-magnetic waves present on metallized areas within the mobile phone caused by components within the mobile phone, the mobile phone comprising:

discrete components placed near an edge of metallized areas, the discrete components obstructing a current path of scattering electro-magnetic waves present on the metallized areas such that electric current due to the scattering electro-magnetic waves present on the metallized areas encounters higher impedances as the scattering electro-magnetic waves flow through the discrete components near the edge of the metallized areas, the high impedances attenuating the scattering electro-magnetic waves emitted from the edge of the metallized areas.

7. The mobile phone of claim 6 wherein the discrete components include resistors.

8. The mobile phone of claim 6 wherein the discrete components include capacitors.

9. The mobile phone of claim 6 wherein the discrete components include inductors.

10. The mobile phone of claim 6 wherein the discrete components include a combination of resistors, capacitors, and inductors.

* * * * *